(12) United States Patent
Lee et al.

(10) Patent No.: US 9,373,602 B2
(45) Date of Patent: Jun. 21, 2016

(54) WIRE STRUCTURE AND SEMICONDUCTOR DEVICE HAVING THE SAME, AND METHOD OF MANUFACTURING THE WIRE STRUCTURE

(71) Applicant: Samsung Electronics Co., Ltd., Suwon-Si, Gyeonggi-Do (KR)

(72) Inventors: Eun-kyung Lee, Seoul (KR); Byoung-lyong Choi, Seoul (KR); Won-Jae Joo, Seongnam-si (KR); Byung-Sung Kim, Suwon-si (KR); Jae-Hyun Lee, Suwon-si (KR); Jong-Woon Lee, Suwon-si (KR); Dong-Mok Whang, Suwon-si (KR)

(73) Assignees: Samsung Electronics Co., Ltd., Gyeonggi-do (KR); Sungkyunkwan University Foundation for Corporate Collaboration, Gyeonggi-do (KR)

( * ) Notice: Subject to any disclaimer, the term of this patent is extended or adjusted under 35 U.S.C. 154(b) by 0 days.

(21) Appl. No.: 14/467,597

(22) Filed: Aug. 25, 2014

(65) Prior Publication Data
US 2015/0061161 A1    Mar. 5, 2015

(30) Foreign Application Priority Data

Aug. 30, 2013  (KR) .................. 10-2013-0104508

(51) Int. Cl.
*H01L 23/48* (2006.01)
*H01L 23/00* (2006.01)
*H01B 1/04* (2006.01)

(52) U.S. Cl.
CPC *H01L 24/45* (2013.01); *H01B 1/04* (2013.01); *H01L 24/43* (2013.01); *H01L 2224/43* (2013.01); *H01L 2224/45015* (2013.01); *H01L 2224/45186* (2013.01); *H01L 2224/45193* (2013.01); *H01L 2224/45663* (2013.01); *H01L 2224/45693* (2013.01); *H01L 2924/12041* (2013.01); *H01L 2924/12043* (2013.01)

(58) Field of Classification Search
CPC ...... H01L 29/0669; H01L 24/45; H01L 24/43
USPC ....................................... 257/784
See application file for complete search history.

(56) References Cited

U.S. PATENT DOCUMENTS

| 7,435,996 | B2 | 10/2008 | Jin et al. |
| 7,453,097 | B2 | 11/2008 | Jin et al. |
| 8,288,190 | B2 | 10/2012 | Kim |
| 8,329,516 | B2 | 12/2012 | Lee |
| 2002/0172820 | A1 | 11/2002 | Majumdar et al. |
| 2012/0199187 | A1 | 8/2012 | Borgstrom et al. |
| 2014/0041711 | A1* | 2/2014 | Gruen .......... B82Y 40/00 136/248 |

FOREIGN PATENT DOCUMENTS

| KR | 20090069911 A | 7/2009 |
| KR | 20090095305 A | 9/2009 |
| KR | 20120063164 A | 6/2012 |

* cited by examiner

*Primary Examiner* — Douglas Menz
(74) *Attorney, Agent, or Firm* — Harness, Dickey & Pierce, P.L.C.

(57) ABSTRACT

According to example embodiments, a wire structure includes a first wire that includes a first wire core and a first carbon shell surrounding the first wire core, and a second wire that extends in a longitudinal direction from the first wire. The first wire core has a wire shape. The first carbon shell contains carbon.

25 Claims, 10 Drawing Sheets wire of claim 1## WIRE STRUCTURE AND SEMICONDUCTOR DEVICE HAVING THE SAME, AND METHOD OF MANUFACTURING THE WIRE STRUCTURE

CROSS-REFERENCE TO RELATED APPLICATIONS

This application claims priority under 35 U.S.C. §119 to Korean Patent Application No. 10-2013-0104508, filed on Aug. 30, 2013, in the Korean Intellectual Property Office, the disclosure of which is incorporated herein in its entirety by reference.

BACKGROUND

1. Field

The present disclosure relates to a wire structure, and more particularly, to a wire structure of which doping is controlled, a semiconductor device including the wire structure, and/or a method of manufacturing the wire structure.

2. Description of Related Art

Nanowires are one-dimensional nano-structures that may have high reactivity because of a high ratio of surface area to volume, and have higher flexibility than a bulk material. When a nanowire has a diameter that is equal to or smaller than a Bohr radius, the nanowire has various properties, such as a change in optical properties, which are different from those of a bulk material. A method of manufacturing a nanowire may include a wet chemical method and a synthesis method. The synthesis method may include using chemical vapor deposition (CVD), which is often used in a semiconductor process. The wet chemical method may have a reduced uniformity and difficulty in controlling doping. Thus, it may be difficult to manufacture a nanowire into a device. Therefore, nanowires are typically manufactured by a synthesis method using CVD.

Nanowires may be manufactured by a vapor-liquid-solid (VLS) method using a catalyst such as a metal. The diameter of the nanowire may be controlled using a catalyst or a pattern, or a growth direction thereof may be controlled using a plane index of a semiconductor substrate. In particular, a dopant is injected into semiconductor nanowires in order to control electrical properties thereof. In this case, in general, a dopant material may be flowed at the same time when the nanowire is synthesized, and thus the dopant material may be injected into the nanowire while the nanowire grows. A doping characteristic and junction control of the nanowire may play an important role in the application to an electrical field, an optical field, or an energy field of the nanowire.

SUMMARY

Example embodiments relate to a wire structure of which doping is controlled in a longitudinal direction, a semiconductor device including the wire structure, and/or a method of manufacturing a wire structure.

Additional aspects will be set forth in part in the description which follows and, in part, will be apparent from the description, or may be learned by practice of example embodiments.

According to example embodiments, a wire structure includes: a first wire that includes a first wire core and a first carbon shell surrounding the first wire core; and a second wire that extends in a longitudinal direction from the first wire. The first wire core has a wire shape. The first carbon shell may contain carbon.

In example embodiments, the first wire core and the second wire may have different doping characteristics.

In example embodiments, the first carbon shell may include at least one of a crystalline carbon layer and an amorphous carbon layer.

In example embodiments, the crystalline carbon layer may include graphene.

In example embodiments, the first wire core and the second wire may include at least one of a Group IV material, a compound, an oxide, and a nitride.

In example embodiments, a diameter of the second wire may be the same as or larger than a diameter of the first wire.

In example embodiments, a diameter of the second wire may be the same as or smaller than a diameter of the first wire core.

In example embodiments, the wire structure may further include a third wire that extends in a longitudinal direction from the second wire. The third wire may include a second wire core and a second carbon shell surrounding the second wire core. The second wire core may have a wire shape. The second carbon shell may include carbon.

According to example embodiments, a semiconductor device includes at least one wire structure; a first electrode that is connected to one end of the wire structure; and a second electrode that is connected to the other end of the wire structure. The wire structure may include a first wire and a second wire that extends in a longitudinal direction from the first wire. The first wire may include a first wire core and a first carbon shell surrounding the first wire core. The first wire core may have a wire shape. The first carbon shell may include carbon.

In example embodiments, the first wire core and the second wire may have different doping characteristics.

In example embodiments, the first carbon shell may include at least one of a crystalline carbon layer and an amorphous carbon layer.

In example embodiments, the first electrode may be on a substrate, and the second electrode may include a transparent electrode.

According to example embodiments, a method of manufacturing a wire structure includes: growing a first wire on a substrate, and growing a second wire that extends a longitudinal direction from the first wire. The first wire may include a wire core and a carbon shell surrounding the wire core. The wire core may have a wire shape. The carbon shell may include carbon.

In example embodiments, the growing the first wire and the growing the second wire may include a synthesis method using chemical vapor deposition (CVD).

In example embodiments, the wire core and the second wire may have different doping characteristics.

In example embodiments, the method may further include forming a catalyst layer on the substrate.

In example embodiments, the wire core and the carbon shell may be grown simultaneously. In other words, the wire core and the carbon shell may be grown at the same time.

In example embodiments, the growing the first wire may include growing the wire core is grown, growing the carbon shell to surround the wire core after the growing the wire core.

In example embodiments, the carbon shell may include at least one of a crystalline carbon layer and an amorphous carbon layer.

In example embodiments, the method may further include removing the carbon shell after growing the second wire.

According to example embodiments, a wire structure includes: a first wire structure elongated in one direction; a second wire structure on one end of the first wire structure, the second wire structure elongated in the one direction, the first and second wire structures having different doping characteristics; and a carbon shell surrounding one of the first and second wire structures.

In example embodiments, the wire structure may further include a third wire structure on the one end of the first wire structure.

In example embodiments, the wire structure may include a plurality of carbon shells. The carbon shell may be a first carbon shell among the plurality of carbon shells and may surround the first wire structure. The plurality of carbon shell may include a second carbon shell. The second carbon shell may surround the third wire structure. The third wire structure may be on one end of the second wire structure.

In example embodiments, the first wire structure may include one of a Group IV material, a Group II-IV material, a Group IV-VI material, a Group IV-V-VI material, an oxide, and a nitride. The second wire structure may include one of a Group IV material, a Group II-IV material, a Group IV-VI material, a Group IV-V-VI material, an oxide, and a nitride.

In example embodiments, a diameter of the first wire structure may be different than a diameter of the second wire structure, one of the first and second wire structures may be a wire core, and the carbon shell may surround the wire core.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
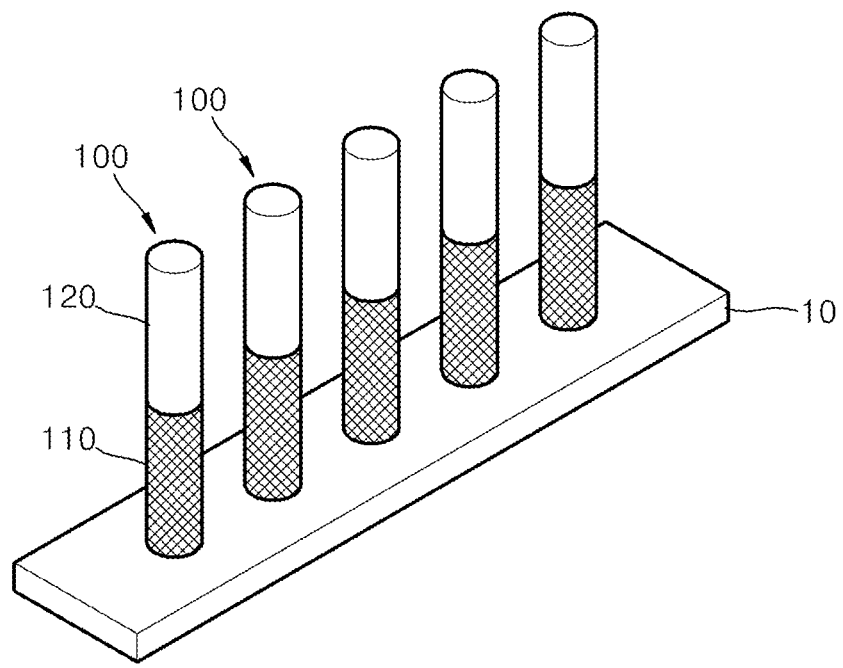
FIG. 1 is a perspective view of wire structures that are provided on a substrate, according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
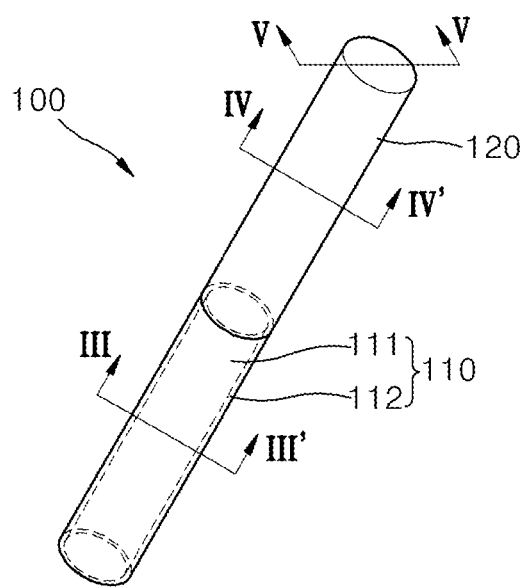
FIG. 2 is an enlarged perspective view of the wire structure illustrated in FIG. 1.
Figure 3:
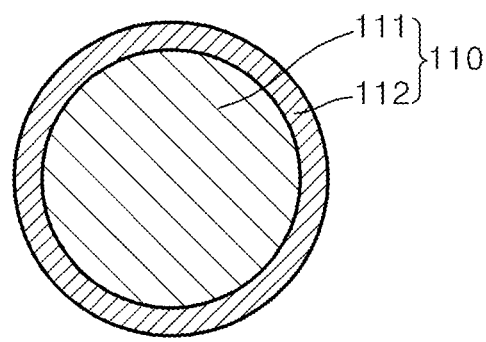
FIG. 3 is a cross-sectional view taken along line III-III' of FIG. 2.
Figure 4:
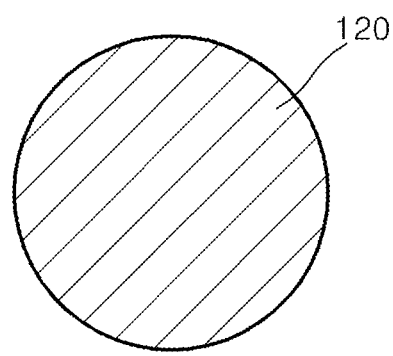
FIG. 4 is a cross-sectional view taken along line IV-IV' of FIG. 2.
Figure 5:
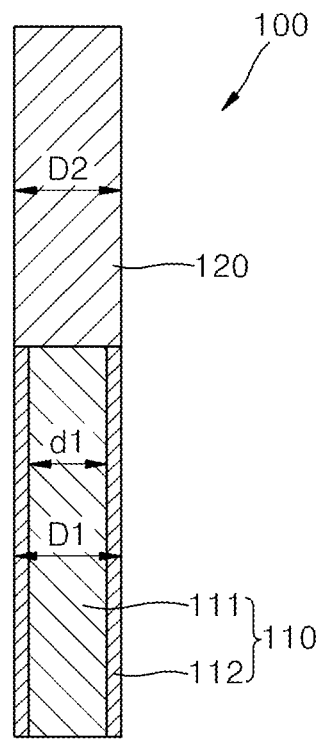
FIG. 5 is a cross-sectional view taken along line V-V' of FIG. 2.

FIG. 1 is a perspective view of wire structures 100 that are provided on a substrate 10, according to example embodiments. Referring to FIG. 1, the plurality of wire structures 100 are vertically arranged in parallel to each other on the substrate 10. FIG. 2 is an enlarged perspective view of the wire structure 100 illustrated in FIG. 1. FIG. 3 is a cross-sectional view taken along line III-III' of FIG. 2. FIG. 4 is a cross-sectional view taken along line IV-IV' of FIG. 2. FIG. 5 is a cross-sectional view taken along line V-V' of FIG. 2.

Referring to FIGS. 1 to 5, the wire structure 100 has a one-dimensional shape. Specifically, the wire structure 100 includes a first wire 110 and a second wire 120 that extends in a longitudinal direction from the first wire 110. Here, the first wire 110 may have a core-shell structure. Specifically, the first wire 110 includes a wire core 111 having a wire shape and a carbon shell 112 that is provided to surround the wire core 111. For example, the wire core 111 may contain at least one of a Group IV material, a compound, an oxide, and a nitride, but example embodiments are not limited thereto. The Group IV material may contain, for example, Ge or Si. The compound may contain, for example, a Group III-V material, a Group II-VI material, a Group IV-VI material, or a Group IV-V-VI material. The wire core 111 may have a desired (and/or alternatively predetermined) doping characteristic. As described later, the wire core 111 may have a doping characteristic that is different from that of the second wire 120. For example, the wire core 111 may be doped with a p-type or n-type dopant.

The carbon shell 112 may be formed of a material containing carbon. For example, the carbon shell 112 may include a crystalline carbon layer such as graphene. However, example embodiments are not limited thereto, and the carbon shell 112 may include an amorphous carbon layer or may include both a crystalline carbon layer and an amorphous carbon layer. The carbon shell 112 may serve as a mask during a process of growing the second wire 120 of the wire structure 110 which will be described later. The carbon shell 112 may be applied to an electronic element so as to perform various roles such as serving as a conductor for electrical connection or serving as a sensing material for sensing a desired (and/or alternatively predetermined) gas. The first wire 110 constituted by the wire core 111 and the carbon shell 112 may have a diameter D1 of, for example, approximately several nm to several tens of µm (e.g., 5 nm to 300 nm).

The second wire 120 extends in a longitudinal direction from the first wire 110. Similarly to the above-described wire core 111 of the first wire 110, the second wire 120 may contain, for example, at least one of a Group IV material, a compound, an oxide, and a nitride, but example embodiments are not limited thereto. The second wire 120 may have a desired (and/or alternatively predetermined) doping characteristic. Specifically, the second wire 120 may have a doping characteristic that is different from that of the wire core 111 of the first wire 110. That is, when the wire core 111 is doped with a p-type dopant, the second wire 120 may be doped with an n-type dopant. Also, when the wire core 111 is doped with an n-type dopant, the second wire 120 may be doped with a p-type dopant. Thus, a p-n junction may be formed at an interface between the wire core 111 and the second wire 120. Meanwhile, when the wire core 111 is doped with an n-type dopant, the second wire 120 may be doped with an $n^+$-type dopant that has a higher doping concentration than that of the wire core 111. In addition, when the wire core 111 is doped with a p-type dopant, the second wire 120 may be doped with a $p^+$-type dopant having a higher doping concentration than that of the wire core 111.

Similarly to the above-described first wire 110, according to example embodiments, the second wire 120 may have a diameter D2 of, for example, approximately several nm to several tens of µm (e.g., 5 nm to 300 nm). In addition, in example embodiments, as illustrated in FIG. 5, the second wire 120 may have a diameter D2 that is the same as the diameter D1 of the first wire 110 constituted by the wire core 111 and the carbon shell 112. Accordingly, the second wire 120 may have the diameter D2 that is larger than the diameter d1 of the wire core 111.

According to example embodiments, the wire structure 100 includes the first wire 110 constituted by the wire core 111 and the carbon shell 112, and the second wire 120 that extends in a longitudinal direction from the first wire 110. Here, the wire core 111 and the second wire 120 may have different doping characteristics. As described later, the carbon shell 112 serves as a mask during a process of growing the second wire 120, and thus the carbon shell 112 may control the doping characteristics of the wire core 111 and the second wire 120, thereby allowing the p-n junction to be formed at a desired position. Since the wire structure 100 of which doping is controlled in such a manner has excellent thermal and electrical characteristics, the wire structure 100 may be applied to various fields such as an electronic element, an optical element, an energy element, a sensor, or a capacitor.

Figure 6:
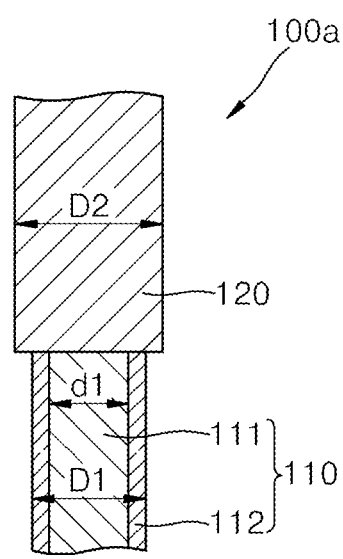
FIG. 6 is a cross-sectional view of a wire structure according to example embodiments.
Figure 7:
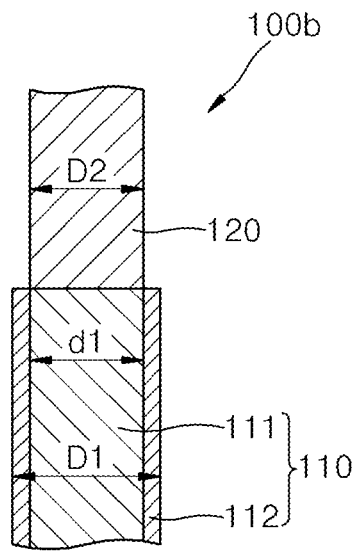
FIG. 7 is a cross-sectional view of a wire structure according to example embodiments.
Figure 8:
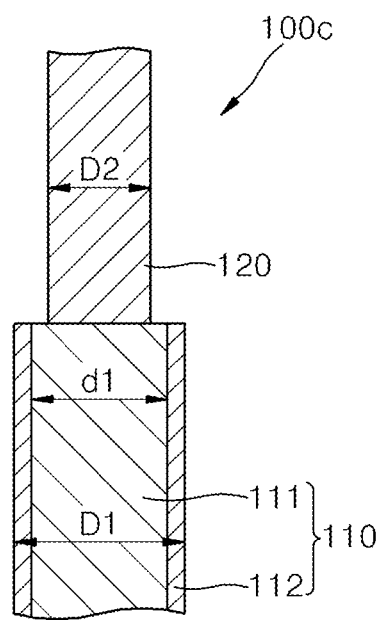
FIG. 8 is a cross-sectional view of a wire structure according to example embodiments.

In example embodiments, the wire structure 100 may have a structure where the diameter D2 of the second wire 120 is the same as the diameter D1 of the first wire 110. However, this is merely a non-limiting example, and the diameters D1 and D2 of the first and second wires 110 and 120 may be modified in various ways. For example, according to example embodiments, in a wire structure 100a illustrated in FIG. 6, a second wire 120 has a diameter D2 that is larger than a diameter D1 of a first wire 110. The second wire 120 has the diameter D2 that is larger than a diameter d1 of the wire core 111 of the first wire 110. According to example embodiments, in a wire structure 100b illustrated in FIG. 7, a second wire 120 has a diameter D2 that is smaller than a diameter D1 of a first wire 110. In this case, the diameter D2 of the second wire 120 may be the same as a diameter d1 of a wire core 111 of the first wire 110. According to example embodiments, in a wire structure 100c illustrated in FIG. 8, a second wire 120 has a diameter D2 that is smaller than a diameter D1 of a first wire 110. In this case, the diameter D2 of the second wire 120 may be smaller than a diameter d1 of a wire core 111 of the first wire 110.

Figure 9:
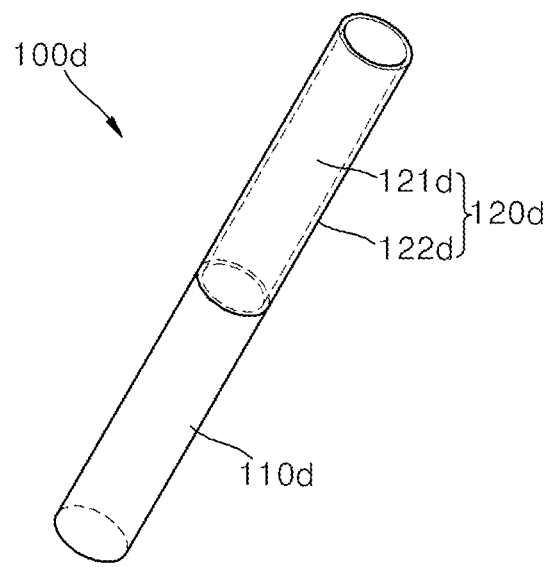
FIG. 9 is a perspective view of a wire structure according to example embodiments.

FIG. 9 is a perspective view of a wire structure 100d according to example embodiments. Hereinafter, a description will be made only on the differences between FIGS. 1-8 and 9.

Referring to FIG. 9, according to example embodiments, the wire structure 100d includes a first wire 110d and a second wire 120d that extends in a longitudinal direction from the first wire 110d. For example, the first wire 110d may contain at least one of a Group IV material, a compound, an oxide, and a nitride, but example embodiments are not limited thereto. The first wire 110d may have a desired (and/or alternatively predetermined) doping characteristic, and specifically, may have a doping characteristic that is different from that of a wire core 121d of the second wire 120d. For example, the first wire 110d may be doped with a p-type or n-type dopant. The first wire 110d may have a diameter of, for example, approximately several nm to several tens of μm (e.g., 5 nm to 300 nm).

The second wire 120d extends in a longitudinal direction from the first wire 110d, and may have a core-shell structure. That is, the second wire 120d includes the wire core 121d having a wire shape, and a carbon shell 122d that surrounds the wire core 121d. Similarly to the above-described first wire 110d, the wire core 121d of the second wire 120d may contain, for example, at least one of a Group IV material, a compound, an oxide, and a nitride, but example embodiments are not limited thereto. The wire core 121d may have a doping characteristic that is different from that of the first wire 110d. For example, when the first wire 110d is doped with a p-type dopant, the wire core 121d of the second wire 120d may be doped with an n-type dopant. When the first wire 110d is doped with an n-type dopant, the wire core 121d of the second wire 120d may be doped with a p-type dopant. Thus, a p-n junction may be formed between the first wire 110d and the wire core 121d. Meanwhile, when the first wire 110d is doped with an n-type dopant, the wire core 121d of the second wire 120d may be doped with an n$^+$-type dopant that has a higher doping concentration than that of the first wire 110d. In addition, when the first wire 110d is doped with a p-type dopant, the wire core 121d of the second wire 120d may be doped with a p$^+$-type dopant having a higher doping concentration than that of the first wire 110d. In such a wire structure 100d, the diameters of the first and second wires 110d and 120d may be modified in various ways as described above.

Figure 10:
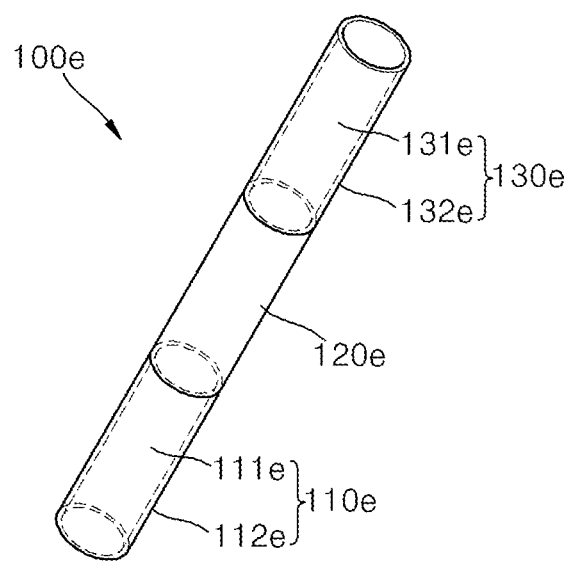
FIG. 10 is a perspective view of a wire structure according to example embodiments.

FIG. 10 is a cross-sectional view of a wire structure 100e according to example embodiments. Hereinafter, a description will be made on only the differences between FIGS. 1-9 and 10.

Referring to FIG. 10, according to example embodiments, the wire structure 100e has a one-dimensional shape. In other words, the wire structure 100e may be elongated in one direction. Specifically, the wire structure 100e includes a first wire 110e, a second wire 120e that extends in a longitudinal direction from the first wire 110e, and a third wire 130e that extends in a longitudinal direction from the second wire 120e. Here, the first and third wires 110e and 130e may have a core-shell structure.

The first wire 110e includes a first wire core 111e having a wire shape, and a first carbon shell 112e that surrounds the first wire core 111e. The first wire core 111e may contain, for example, at least one of a Group IV material, a compound, an oxide, and a nitride, but example embodiments are not limited thereto. The first wire core 111e may have a doping characteristic that is different from that of the second wire 120e. For example, the first wire core 111e may be doped with a p-type or n-type dopant. The first carbon shell 112e may be formed of a material containing carbon. For example, the first carbon shell 112e may include at least one of a crystalline carbon layer and an amorphous carbon layer. The crystalline carbon layer may contain graphene. The first wire 110e constituted by the first wire core 111e and the first carbon shell 112e may have a diameter D1 of, for example, approximately several nm to several tens of μm (e.g., 5 nm to 300 nm).

The second wire 120e extends in a longitudinal direction from the first wire 110e. Here, similarly to the first wire core 111e of the first wire 110e, the second wire 120e may contain, for example, at least one of a Group IV material, a compound, an oxide, and a nitride, but example embodiments are not limited thereto. The second wire 120e may have a doping characteristic that is different from the above-described first wire core 111e of the first wire 110e. For example, when the first wire core 111e is doped with a p-type dopant, the second wire 120e may be doped with an n-type dopant. When the first wire core 111e is doped with an n-type dopant, the second wire 120e may be doped with a p-type dopant. Thus, a p-n junction may be formed at an interface between the first wire core 111e and the second wire 120e. When the first wire core 111e is doped with an n-type dopant, the second wire 120e may be doped with an n$^+$-type dopant that has a higher doping concentration than that of the first wire core 111e. In addition, when the first wire core 111e is doped with a p-type dopant, the second wire 120e may be doped with a p$^+$-type dopant having a higher doping concentration than that of the first wire core 111e. The second wire 120e may have a diameter of, for example, approximately several nm to several tens of μm (e.g., 5 nm to 300 nm).

The third wire 130e extends in a longitudinal direction from the second wire 120e. The third wire 130e includes a second wire core 131e having a wire shape, and a second carbon shell 132e that surrounds the second wire core 131e. Similarly to the first wire core 111e, the second wire core 131e may contain, for example, at least one of a Group IV material, a compound, an oxide, and a nitride, but example embodiments are not limited thereto. In addition, the second wire core 131e may have a desired (and/or alternatively predetermined) doping characteristic. Specifically, the second wire core 131e may have a doping concentration that is different from that of the second wire 120e. Similarly to the first carbon shell 112e, the second carbon shell 132e may include at least one of a crystalline carbon layer and an amorphous carbon layer. The crystalline carbon layer may contain graphene. The third wire 130e constituted by the second wire core 131e and the second carbon shell 132e may have a diameter of, for example, approximately several nm to several tens of μm (e.g., 5 nm to 300 nm). In the wire structure 100e, the diameters of the first, second, and third wires 110e, 120e, and 130e may be modified in various ways. Although not shown in FIG. 10, a fourth wire having a doping concentration or doping concentration that is different from that of the second wire core 131e may extend in a longitudinal direction from the third wire 130e, or a fifth wire having a core-shell structure and having a doping characteristic that is different from that of the fourth wire may extend in a longitudinal direction from the fourth wire.

Figure 11:
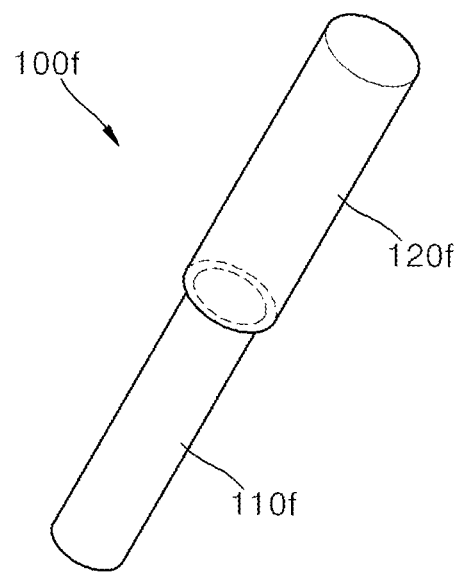
FIG. 11 is a perspective view of a wire structure according to example embodiments.

FIG. 11 is a perspective view of a wire structure 100*f* according to example embodiments. Hereinafter, a description will be made only on the differences between FIGS. 1-10 and 11. Referring to FIG. 11, according to example embodiments, the wire structure 100*f* includes a first wire 110*f* and a second wire 120*f* that extends in a longitudinal direction from the first wire 110*f*. Here, the first and second wires 110*f* and 120*f* may have different doping characteristics. For example, when the first wire 110*f* is doped with a p-type dopant, the second wire 120*f* may be doped with an n-type dopant. When the first wire 110*f* is doped with an n-type dopant, the second wire 120*f* may be doped with a p-type dopant. When the first wire 110*f* is doped with an n-type dopant, the second wire 120*f* may be doped with an $n^+$-type dopant that has a higher doping concentration than that of the first wire 110*f*. When the first wire 110*f* is doped with a p-type dopant, the second wire 120*f* may be doped with a $p^+$-type dopant having a higher doping concentration than that of the first wire 110*f*.

The wire structure 100*f* has the same structure as the wire structure 100 illustrated in FIGS. 1 to 5 from which the carbon shell 112 is removed. The carbon shell 112 of the wire structure 100 illustrated in FIGS. 1 to 5 may be removed from a surface of the wire core 111 by a method, for example, ashing. Thus, according to example embodiments, in the wire structure 100*f*, the doping characteristics of the first and second wires 110*f* and 120*f* may be controlled, and thus a p-n junction may be formed at a desired position.

Figure 12:
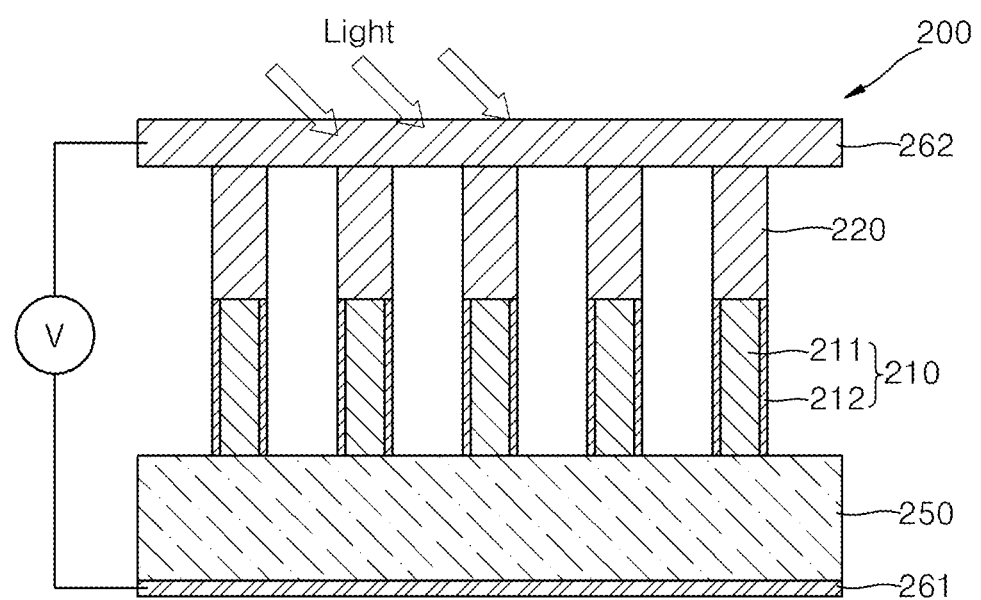
FIG. 12 is a cross-sectional view of a semiconductor device according to example embodiments.

FIG. 12 is a cross-sectional view of a semiconductor device 200 according to example embodiments.

Referring to FIG. 12, a plurality of wire structures are arranged in a desired (and/or alternatively predetermined) pattern on a top surface of a substrate 250, and a first electrode 261 is provided on a bottom surface of the substrate 250. Upper ends of the wire structures are connected to a second electrode 262. The substrate 250 is a conductive substrate, and may contain, for example, Ge or Si. However, example embodiments are not limited thereto, and the second electrode 262 may include, for example, a transparent electrode. Alternatively, only one wire structure may be provided between the substrate 250 and the second electrode 262.

Each of the wire structures includes a first wire 210, and a second wire 220 that extends in a longitudinal direction from the first wire 210. The first wire 210 has a core-shell structure, and includes a wire core 211 and a carbon shell 212. Here, the wire core 211 and the second wire 220 may have different doping characteristics. Specifically, when the wire core 211 is doped with a p-type dopant, the second wire 220 may be doped with an n-type dopant. The first and second electrodes 261 and 262 may serve as p-type and n-type electrodes, respectively. In addition, when the wire core 211 is doped with an n-type dopant, the second wire 220 may be doped with a p-type dopant. The first and second electrodes 261 and 262 may serve as n-type and p-type electrodes, respectively. When the wire core 211 is doped with an n-type dopant, the second wire 220 may be doped with an $n^+$-type dopant that has a higher doping concentration than that of the wire core 211. When the wire core 211 is doped with a p-type dopant, the second wire 220 may be doped with a $p^+$-type dopant having a higher doping concentration than that of the wire core 211. In the semiconductor device according to example embodiments, each of the wire structures may be the same as one or more of the wire structures 100 illustrated in FIGS. 1 to 5, and a detailed description thereof is not repeated. In the semiconductor device 200 according to example embodiments, the wire structures 100*a* to 100*f* illustrated in FIGS. 6 to 11 may be applied. In other words, the wire structures 100*a* to 100*f* may be substituted with the wire structure 100 in the semiconductor device 200 according to example embodiments.

In the semiconductor device 200 having such a structure, when light is incident on the wire structures through the second electrode 262, holes and electrons (or electrons and holes) move from the wire core 211 and the second wire 220 which have different doping characteristics to the first and second electrodes 261 and 262, and thus electrical energy may be generated between the first and second electrodes 261 and 262. According to example embodiments, the semiconductor device 200 may be applied as a light-receiving element such as a photodiode or a solar cell.

Figure 13:
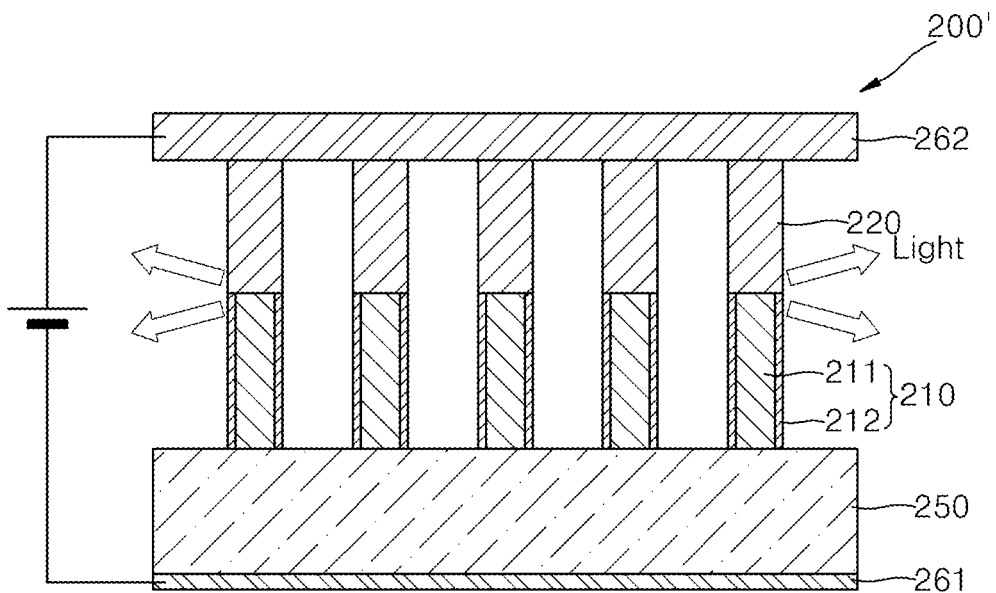
FIG. 13 is a cross-sectional view of a semiconductor device according to example embodiments.

FIG. 13 is a cross-sectional view of a semiconductor device 200' according to example embodiments.

The semiconductor device 200' illustrated in FIG. 13 has the same structure as the semiconductor device 200 illustrated in FIG. 12 except that the semiconductor device 200' is a light-emitting element. Accordingly, a description of the structure of the semiconductor device 200' illustrated in FIG. 13 is omitted. In the semiconductor device 200' illustrated in FIG. 13, when desired (and/or alternatively predetermined) electrical energy is applied between first and second electrodes 261 and 262, light having a desired (and/or alternatively predetermined) color may be emitted from an interface between a wire core 211 and a second wire 220, which have different doping characteristics, due to coupling between holes and electrons. In example embodiments, the semiconductor device 200' may be applied as a light-emitting element such as a light-emitting diode.

Figure 14:
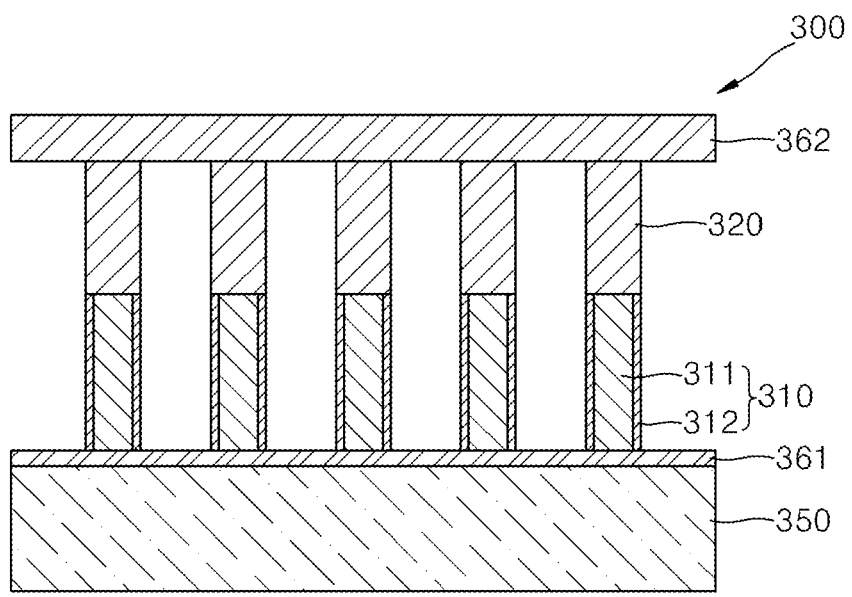
FIG. 14 is a cross-sectional view of a semiconductor device according to example embodiments.

FIG. 14 is a cross-sectional view of a semiconductor device 300 according to example embodiments.

The semiconductor device 300 illustrated in FIG. 14 has the same structure as the semiconductor devices 200 and 200' illustrated in FIGS. 12 and 13 except that a first electrode 361 is provided on a top surface of a substrate 350. Referring to FIG. 14, the first electrode 361 is provided on the top surface of the substrate 350, and a plurality of wire structures are arranged on the first electrode 361. A second electrode 362 is provided on the wire structures. The substrate 350 may contain an insulating material as well as a conductive material. Each of the wire structures includes a first wire 310 and a second wire 320 that extends in a longitudinal direction from the first wire 310. The first wire 310 has a core-shell structure, and includes a wire core 311 and a carbon shell 312. Here, the wire core 311 and the second wire 320 may have different doping characteristics. The semiconductor device 300 illustrated in FIG. 14 may be applied as a light-receiving element or a light-emitting element. In FIGS. 12 to 14, cases where the semiconductor devices 200, 200', and 300 are applied as a light-receiving element or a light-emitting element have been described. However, in example embodiments, various electronic element, optical elements, energy element, sensors, or capacitors using the above-described wire structure may be configured.

Figure 15A:
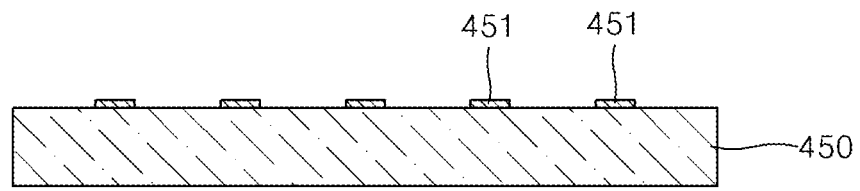
FIGS. 15A to 15C are diagrams illustrating a method of manufacturing a wire structure, according to example embodiments.
Figure 15B:
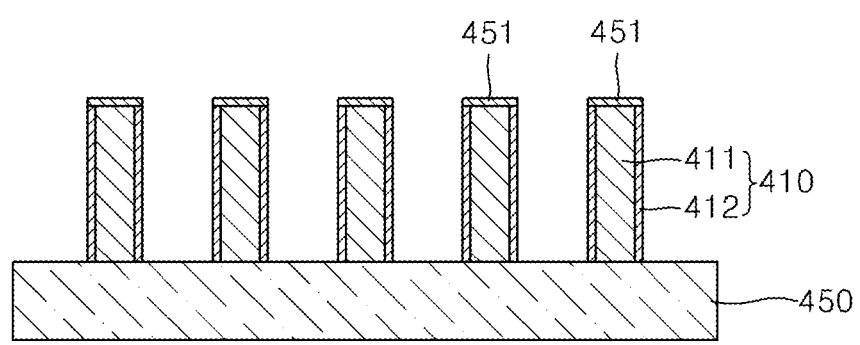
Figure 15C:
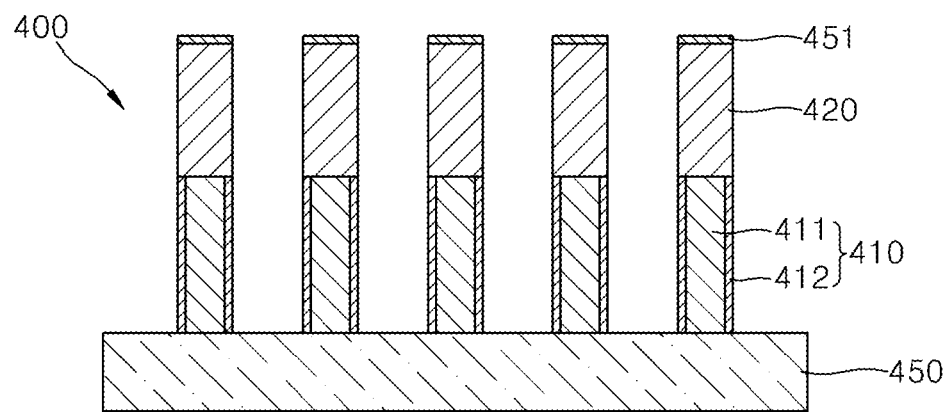

Hereinafter, a method of manufacturing a wire structure according to example embodiments will be described. FIGS. 15A to 15C are diagrams illustrating a method of manufacturing a wire structure 400, according to example embodiments.

Referring to FIG. 15A, first, a substrate 450 is provided. The substrate 450 may be a substrate for growing wire structures 400 (see FIG. 15C). The substrate 450 may contain, for example, a semiconductor, quartz, glass, or sapphire, but example embodiments are not limited thereto. Subsequently, a catalyst layer 451 is formed on the substrate 450. The catalyst layer 451 facilitates the growth of the wire structures 400. The catalyst layer 451 may contain, for example, a transition metal, but example embodiments are not limited thereto. As a specific example, the catalyst layer 451 may contain Au, Ag, Al, or Pt. Alternatively, in example embodiments, the catalyst layer 451 may not be formed, and thus, the wire structures 400 may be directly grown on the substrate 450.

Referring to FIG. 15B, a first wire 410 having a core-shell structure may be grown from the catalyst layer 451. The first wire 410 includes a wire core 411 having a wire shape and containing a semiconductor material, and a carbon shell 412 that surrounds the wire core 411. Here, the wire core 411 may have a desired (and/or alternatively predetermined) doping characteristic. For example, the wire core 411 may be doped with a p-type or n-type dopant. The wire core 411 may contain, for example, at least one of a Group IV material, a compound, an oxide, and a nitride, but example embodiments are not limited thereto. The Group IV material may contain, for example, Ge or Si, and the compound may contain, for example, a Group III-V material, a Group II-VI material, a Group IV-VI material, or a Group IV-V-VI material. The carbon shell 412 may be formed of a material containing carbon. For example, the carbon shell 412 may include a crystalline carbon layer such as graphene. However, example embodiments are not limited thereto, and the carbon shell 412 may include an amorphous carbon layer or may include both a crystalline carbon layer and an amorphous carbon layer.

The first wire 410 may be grown by a synthesis method using CVD. Specifically, a carbon source material, a source material of the wire core 411, and a desired (and/or alternatively predetermined) doping source material are injected into a chamber (not shown), and then the inside of the chamber may be heated to a desired (and/or alternatively predetermined) temperature (for example, approximately 200° C. to 1200° C.). Thus, the wire core 411 may be grown from the catalyst layer 451 on the substrate 450, and the carbon shell 412 may be grown on a surface of the wire core 411. The first wire 410 constituted by the wire core 411 and the carbon shell 412 may be grown so as to have a diameter of, for example, approximately several nm to several tens of μm (e.g., 5 nm to 300 nm).

Referring to FIG. 15C, the first wire 410 constituted by the wire core 411 and the carbon shell 412 is grown as described above, and then a second wire 420 is grown in a longitudinal direction from the first wire 410, thereby completing the manufacture of the wire structures 400. Similarly to the wire core 411, the second wire 420 may contain, for example, at least one of a Group IV material, a compound, an oxide, and a nitride, but example embodiments are not limited thereto. The second wire 420 may have a doping characteristic that is different from that of the wire core 411. Specifically, when the wire core 411 is doped with a p-type dopant, the second wire 420 may be doped with an n-type dopant. When the wire core 411 is doped with an n-type dopant, the second wire 420 may be doped with a p-type dopant. Thus, a p-n junction may be formed at an interface between the wire core 411 and the second wire 420. When the first wire core 411 is doped with an n-type dopant, the second wire 420 may be doped with an $n^+$-type dopant that has a higher doping concentration than that of the first wire core 411. In addition, when the first wire core 411 is doped with a p-type dopant, the second wire 420 may be doped with a $p^+$-type dopant having a higher doping concentration than that of the first wire core 411.

The second wire 420 may be grown by CVD. Specifically, a source material of the second wire 420 and a desired (and/or alternatively predetermined) doping source material are injected into the chamber, and then the inside of the chamber may be heated to a desired (and/or alternatively predetermined) temperature (for example, approximately 200° C. to 1200° C.). Thus, the second wire 420 may be grown along a longitudinal direction from the first wire 410. During the process of growing the second wire 420, the carbon shell 412 of the first wire 410 may serve as a mask. Accordingly, the doping characteristics of the wire core 411 and the second wire 420 may be controlled, and thus a p-n junction may be formed at a desired position. The second wire 420 may be grown so as to have a diameter of, for example, approximately several nm to several tens of μm (e.g., 5 nm to 300 nm). In addition, after the second wire 420 is grown, the carbon shell 412 of the first wire 410 may be removed by, for example, ashing. Alternatively, if the carbon shell 412 is not completely removed, carbon may remain on the surface of the wire core 411 of the first wire 410. The method illustrated in FIGS. 15A and 15C and described above may also be modified to a case where the wire structures 100d and 100e having structures illustrated in FIGS. 9 and 10 are manufactured.

Figure 16A:
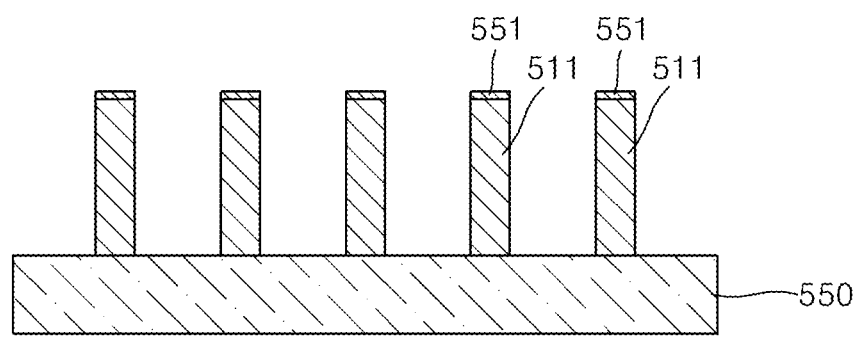
FIGS. 16A to 16C are diagrams illustrating a method of manufacturing a wire structure, according to example embodiments.
Figure 16B:
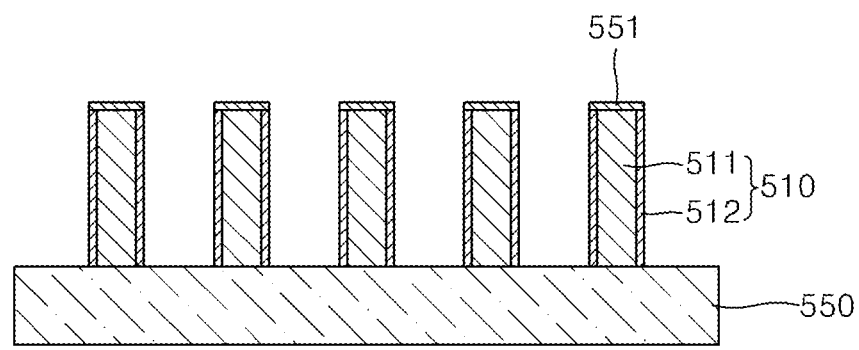
Figure 16C:
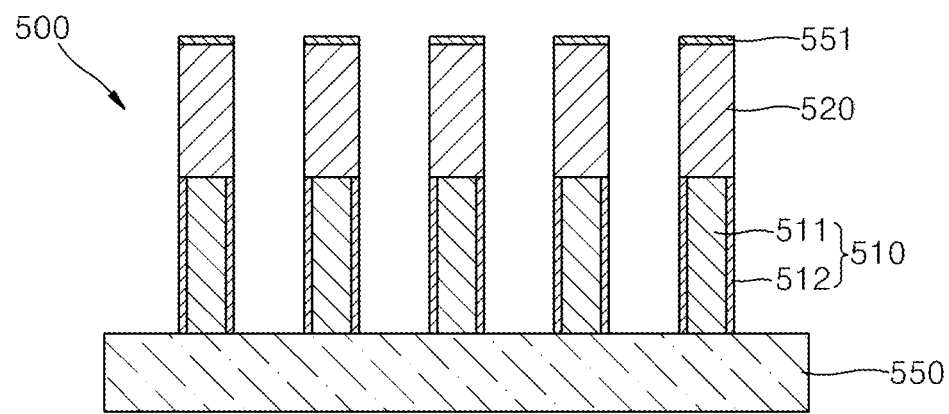

FIGS. 16A to 16C are diagrams illustrating a method of manufacturing a wire structure 500, according to example embodiments. Hereinafter, a description will be made only on the differences between FIGS. 15A and 15C and 16A to 16C.

Referring to FIG. 16A, a substrate 550 is provided, and then a catalyst layer 551 is formed on the substrate 550. The substrate 550 and the catalyst layer 551 have been described above, and thus a description thereof is not repeated. Subsequently, a wire core 511 is grown from the catalyst layer 551. Here, the wire core 511 may have a desired (and/or alternatively predetermined) doping characteristic or doping concentration. The wire core 511 may be grown by CVD. Specifically, a source material of the wire core 511 and a desired (and/or alternatively predetermined) doping source material are injected into the chamber, and then the inside of the chamber is heated to a desired (and/or alternatively predetermined) temperature (for example, approximately 200° C. to 1200° C.). Thus, the wire core 511 may be grown from the catalyst layer 551 on the substrate 550.

Referring to FIG. 16B, a carbon shell 512 is grown on a surface of the wire core 511. Thus, a first wire 510 having a core-shell structure may be formed. The carbon shell 512 may include at least one of a crystalline carbon layer and an amorphous carbon layer. The carbon shell 512 may be grown by CVD. Specifically, a carbon source material is injected into the chamber, and then the inside of the chamber is heated to a desired (and/or alternatively predetermined) temperature, and thus the carbon shell 512 may be grown on the surface of the wire core 511. The first wire 510 constituted by the wire core 511 and the carbon shell 512 may have a diameter of, for example, approximately several nm to several tens of μm (e.g., 5 nm to 300 nm).

Referring to FIG. 16C, after the first wire 510 is grown as described above, the second wire 520 is grown in a longitudinal direction from the first wire 510, thereby completing the manufacture of the wire structures 500. Similarly to the wire core 511 of the first wire 510, the second wire 520 may contain, for example, at least one of a Group IV material, a compound, an oxide, and a nitride, but example embodiments are not limited thereto. The second wire 520 may have a doping characteristic that is different from that of the wire core 511. Specifically, when the wire core 511 is doped with a p-type dopant, the second wire 520 may be doped with an n-type dopant. When the wire core 511 is doped with an n-type dopant, the second wire 520 may be doped with a p-type dopant. Thus, a p-n junction may be formed at an interface between the wire core 511 and the second wire 520. When the wire core 511 is doped with an n-type dopant, the second wire 520 may be doped with an n+-type dopant that has a higher doping concentration than that of the wire core 511. When the wire core 511 is doped with a p-type dopant, the second wire 520 may be doped with a p+-type dopant having a higher doping concentration than that of the wire core 511.

The second wire 520 may be formed by CVD. Specifically, a source material of the second wire 520 and a desired (and/or alternatively predetermined) doping source material are injected into the chamber, and then the inside of the chamber is heated to a desired (and/or alternatively predetermined) temperature (for example, approximately 200° C. to 1200° C.). Thus, the second wire 520 may be grown along a longitudinal direction from the first wire 510. During such a process of growing the second wire 520, the carbon shell 512 of the first wire 510 may serve as a mask. Thus, the doping characteristics of the wire core 511 and the second wire 520 may be controlled, and a p-n junction may be formed at a desired position. The second wire 520 may be grown so as to have a diameter of, for example, approximately several nm to several tens of μm (e.g., 5 nm to 300 nm). After the second wire 520 is grown, the carbon shell 512 of the first wire 510 may be removed by, for example, ashing. Alternatively, if the carbon shell 512 is not completely removed, carbon may remain on the surface of the wire core 511 of the first wire 510. In addition, the method illustrated in FIGS. 16A to 16C and described above may also be applied to a case where the wire structures 100d and 100e having structures illustrated in FIGS. 9 and 10 are manufactured.

According to example embodiments, a wire structure includes a first wire constituted by a wire core and a carbon shell, and a second wire that extends in a longitudinal direction from the first wire. The carbon shell of the first wire serves as a mask, and thus doping characteristics of the wire core and the second wire may be controlled, thereby forming a p-n junction at a desired position. Since the wire structure of which doping is controlled in such a manner has excellent thermal and electrical characteristics, the wire structure may be applied to various fields such as an electronic element, an optical element, an energy element, a sensor, or a capacitor.

It should be understood that example embodiments described herein should be considered in a descriptive sense only and not for purposes of limitation. Descriptions of features or aspects within each wire structure and/or semiconductor device and/or method of manufacturing the same according to example embodiments should typically be considered as available for other similar features or aspects in other wire structures and/or semiconductor device and/or methods of manufacturing the same according to example embodiments.

While some example embodiments have been particularly shown and described, it will be understood by one of ordinary skill in the art that variations in form and detail may be made therein without departing from the spirit and scope of the claims.

What is claimed is:

1. A wire structure comprising:
 a first wire including a first wire core and a first carbon shell surrounding the first wire core, the first wire core having a wire shape, and the first carbon shell containing carbon; and
 a second wire that extends in a longitudinal direction from the first wire,
 wherein the second wire is not surrounded by the first carbon shell.

2. The wire structure of claim 1, wherein the first wire core and the second wire have different doping characteristics.

3. The wire structure of claim 1, wherein the first carbon shell includes at least one of a crystalline carbon layer and an amorphous carbon layer.

4. The wire structure of claim 3, wherein the crystalline carbon layer includes graphene.

5. The wire structure of claim 1, wherein the first wire core and the second wire include at least one of a Group IV material, a compound, an oxide, and a nitride.

6. The wire structure of claim 1, wherein a diameter of the second wire is greater than or equal to a diameter of the first wire.

7. The wire structure of claim 1, wherein a diameter of the second wire is less than or equal to a diameter of the first wire core.

8. The wire structure of claim 1, further comprising:
 a third wire that extends in the longitudinal direction from the second wire, wherein
 the third wire includes a second wire core and a second carbon shell surrounding the second wire core, and
 the second wire core has the wire shape.

9. A semiconductor device comprising:
 at least one wire structure according to claim 1;
 a first electrode that is connected to one end of the wire structure; and
 a second electrode that is connected to the other end of the wire structure,
 wherein the second wire is not surrounded by the first carbon shell.

10. The semiconductor device of claim 9, wherein the first wire core and the second wire have different doping characteristics.

11. The semiconductor device of claim 9, wherein the first carbon shell includes at least one of a crystalline carbon layer and an amorphous carbon layer.

12. The semiconductor device of claim 9, further comprising:
 a substrate, wherein
 the first electrode is on the substrate, and
 the second electrode includes a transparent electrode.

13. A method of manufacturing a wire structure, the method comprising:
 growing a first wire,
 the first wire including a first wire core and a first carbon shell surrounding the first wire core, the first wire core having a wire shape, and the first carbon shell containing carbon; and
 growing a second wire that extends a longitudinal direction from the first wire, wherein the second wire is not surrounded by the first carbon shell.

14. The method of claim 13, wherein the growing the first wire and the growing the second wire include a synthesis method using chemical vapor deposition (CVD).

15. The method of claim 13, wherein the first wire core and the second wire have different doping characteristics.

16. The method of claim 13, further comprising:
 forming a catalyst layer on a substrate, wherein
 the growing the first wire includes growing the first wire on the substrate.

17. The method of claim 13, wherein the first wire core and the first carbon shell are grown simultaneously.

18. The method of claim 13, wherein the growing the first wire includes:
 growing the first wire core; and
 growing the first carbon shell to surround the first wire core after the growing the first wire core.

19. The method of claim 13, wherein the carbon shell includes at least one of a crystalline carbon layer and an amorphous carbon layer.

20. The method of claim 13, further comprising:
removing the first carbon shell after growing the second wire.

21. A wire structure, comprising:
a first wire structure elongated in one direction;
a second wire structure on one end of the first wire structure,
the second wire structure elongated in the one direction,
the first and second wire structures having different doping characteristics; and
a carbon shell surrounding one of the first and second wire structures,
wherein the other of the first and second wire structures is not surrounded by the carbon shell.

22. The wire structure of claim 21, further comprising:
a third wire structure on the one end of the first wire structure.

23. The wire structure of claim 22, further comprising:
a plurality of carbon shells, wherein
the carbon shell is a first carbon shell among the plurality of carbon shells and surrounds the first wire structure,
the plurality of carbon shells includes a second carbon shell,
the second carbon shell surrounds the third wire structure, and
the third wire structure is on one end of the second wire structure.

24. The wire structure of claim 21, wherein
the first wire structure includes one of a Group IV material, a Group II-V material, a Group IV-VI material, a Group IV-V-VI material, an oxide, and a nitride; and
the second wire structure includes one of a Group IV material, a Group II-V material, a Group IV-VI material, a Group IV-V-VI material, an oxide, and a nitride.

25. The wire structure of claim 21, wherein
a diameter of the first wire structure is different than a diameter of the second wire structure,
one of the first and second wire structures is a wire core, and
the carbon shell surrounds the wire core.

* * * * *